(12) United States Patent
Tanaka et al.

(10) Patent No.: US 7,682,949 B2
(45) Date of Patent: *Mar. 23, 2010

(54) LASER TREATMENT DEVICE, LASER TREATMENT METHOD, AND SEMICONDUCTOR DEVICE FABRICATION METHOD

(75) Inventors: Koichiro Tanaka, Atsugi (JP); Tomoaki Moriwaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 549 days.

This patent is subject to a terminal disclaimer.

(21) Appl. No.: 11/525,956

(22) Filed: Sep. 25, 2006

(65) Prior Publication Data

US 2007/0017907 A1 Jan. 25, 2007

Related U.S. Application Data

(62) Division of application No. 10/237,173, filed on Sep. 9, 2002, now Pat. No. 7,112,517.

(30) Foreign Application Priority Data

Sep. 10, 2001 (JP) ............................... 2001-273482
Sep. 10, 2001 (JP) ............................... 2001-273770

(51) Int. Cl.
*H01L 21/20* (2006.01)
(52) U.S. Cl. ............... 438/487; 438/795; 438/E29.003; 257/E29.003
(58) Field of Classification Search ................. 438/487, 438/149, 166, 154, 199, 797, 795; 219/121.66, 219/121.85

See application file for complete search history.

(56) References Cited

U.S. PATENT DOCUMENTS 4,309,225 A 1/1982 Fan et al.

(Continued)

FOREIGN PATENT DOCUMENTS

EP 0 878 789 11/1998

(Continued)

OTHER PUBLICATIONS

F. Takeuchi et al., *Performance of Poly-Si TFTs Fabricated by a Stable Scanning CW Laser Crystallization*, AM-LCD 2001 Digest of Technical Papers, Jan. 1, 2001, pp. 251-254.

(Continued)

*Primary Examiner*—Davienne Monbleau
*Assistant Examiner*—Hoa B Trinh
(74) *Attorney, Agent, or Firm*—Eric J. Robinson; Robinson Intellectual Property Law Office, P.C.

(57) ABSTRACT

A semiconductor film formed on a substrate is crystallized by continuously oscillating type laser. The scanning direction of the continuously oscillating type laser and the crystallization direction are coincident with each other. Adjustment of the crystallization direction and the charge transferring direction of the thin film transistors makes control of the characteristics of the thin film transistors possible. With respect to the laser treatment device for crystallizing the semiconductor film, the beam shape of laser oscillated from the continuously oscillating type laser device is made to be elliptical by a cylindrical lens and said cylindrical lens is made rotatable and said laser beam is scanned on said substrate by a galvanomirror and said laser beam can be focused upon said substrate by f-θlens.

10 Claims, 12 Drawing Sheets

U.S. PATENT DOCUMENTS

| | | | |
|---|---|---|---|
| 4,330,363 A | 5/1982 | Biegesen et al. |
| 4,536,231 A | 8/1985 | Kasten |
| 4,822,752 A | 4/1989 | Sugahara et al. |
| 5,173,792 A | 12/1992 | Matsueda |
| 5,305,759 A | 4/1994 | Kaneko et al. |
| 5,336,879 A | 8/1994 | Sauer |
| 5,432,122 A | 7/1995 | Chae |
| 5,494,781 A | 2/1996 | Ohtani et al. |
| 5,521,107 A | 5/1996 | Yamazaki et al. |
| 5,529,951 A | 6/1996 | Noguchi et al. |
| 5,583,369 A | 12/1996 | Yamazaki et al. |
| 5,589,406 A | 12/1996 | Kato et al. |
| 5,650,636 A | 7/1997 | Takemura et al. |
| 5,684,365 A | 11/1997 | Tang et al. |
| 5,712,191 A | 1/1998 | Nakajima et al. |
| 5,729,308 A | 3/1998 | Yamazaki et al. |
| 5,789,763 A | 8/1998 | Kato et al. |
| 5,824,574 A | 10/1998 | Yamazaki et al. |
| 5,893,990 A | 4/1999 | Tanaka |
| 5,904,770 A | 5/1999 | Ohtani et al. |
| 5,929,464 A | 7/1999 | Yamazaki et al. |
| 5,932,893 A | 8/1999 | Miyanaga et al. |
| 5,937,282 A | 8/1999 | Nakajima et al. |
| 5,942,856 A | 8/1999 | Koyama |
| 5,943,593 A | 8/1999 | Noguchi et al. |
| 5,946,561 A | 8/1999 | Yamazaki et al. |
| 5,953,597 A | 9/1999 | Kusumoto et al. |
| 5,956,603 A | 9/1999 | Talwar et al. |
| 5,960,323 A | 9/1999 | Wakita et al. |
| 5,976,959 A | 11/1999 | Huang |
| 5,981,974 A | 11/1999 | Makita |
| 6,013,928 A | 1/2000 | Yamazaki et al. |
| 6,096,581 A | 8/2000 | Zhang et al. |
| 6,100,860 A | 8/2000 | Takayama et al. |
| 6,118,149 A | 9/2000 | Nakagawa et al. |
| 6,204,099 B1 | 3/2001 | Kusumoto et al. |
| 6,232,156 B1 | 5/2001 | Ohtani et al. |
| 6,242,289 B1 | 6/2001 | Nakajima et al. |
| 6,265,745 B1 | 7/2001 | Kusumoto et al. |
| 6,355,940 B1 | 3/2002 | Koga et al. |
| 6,373,026 B1 | 4/2002 | Kurosawa et al. |
| 6,417,031 B2 | 7/2002 | Ohtani et al. |
| 6,417,896 B1 | 7/2002 | Yamazaki et al. |
| 6,465,268 B2 | 10/2002 | Hirakata et al. |
| 6,475,840 B1 | 11/2002 | Miyanaga et al. |
| 6,479,837 B1 | 11/2002 | Ogawa et al. |
| 6,498,369 B1 | 12/2002 | Yamazaki et al. |
| 6,501,448 B1 | 12/2002 | Komiya et al. |
| 6,509,212 B1 | 1/2003 | Zhang et al. |
| 6,515,428 B1 | 2/2003 | Yeh et al. |
| 6,552,768 B1 | 4/2003 | Matsuda |
| 6,556,711 B2 | 4/2003 | Koga et al. |
| 6,639,686 B1 | 10/2003 | Ohara |
| 6,646,288 B2 | 11/2003 | Yamazaki et al. |
| 6,661,180 B2 | 12/2003 | Koyama |
| 6,700,096 B2 | 3/2004 | Yamazaki et al. |
| 6,709,905 B2 | 3/2004 | Kusumoto et al. |
| 6,717,105 B1 | 4/2004 | Okamoto et al. |
| 6,723,590 B1 | 4/2004 | Zhang et al. |
| 6,730,550 B1 | 5/2004 | Yamazaki et al. |
| 6,743,650 B2 | 6/2004 | Hirakata et al. |
| 6,872,607 B2 | 3/2005 | Tanaka |
| 6,872,910 B2 | 3/2005 | Tanaka et al. |
| 6,919,533 B2 | 7/2005 | Yamazaki et al. |
| 7,112,517 B2 * | 9/2006 | Tanaka et al. ............... 438/487 |
| 2001/0024187 A1 | 9/2001 | Sato et al. |
| 2001/0045563 A1 | 11/2001 | Kusumoto et al. |
| 2001/0051398 A1 | 12/2001 | Hirakata et al. |
| 2002/0014623 A1 | 2/2002 | Kusumoto et al. |
| 2002/0097350 A1 | 7/2002 | Haven et al. |
| 2003/0016196 A1 | 1/2003 | Lueder et al. |
| 2003/0017634 A1 | 1/2003 | Hirakata et al. |
| 2003/0024905 A1 | 2/2003 | Tanaka |
| 2003/0025166 A1 | 2/2003 | Yamazaki et al. |
| 2003/0052336 A1 | 3/2003 | Yamazaki et al. |
| 2003/0059990 A1 | 3/2003 | Yamazaki |
| 2003/0062845 A1 | 4/2003 | Yamazaki et al. |
| 2003/0075733 A1 | 4/2003 | Yamazaki et al. |
| 2004/0106237 A1 | 6/2004 | Yamazaki |

FOREIGN PATENT DOCUMENTS

| | | |
|---|---|---|
| EP | 1 045 447 | 10/2000 |
| EP | 1 058 311 | 12/2000 |
| JP | 62-104117 | 5/1987 |
| JP | 02-020681 | 1/1990 |
| JP | 02-140915 | 5/1990 |
| JP | 02-181419 | 7/1990 |
| JP | 04-256382 | 9/1992 |
| JP | 06-055282 | 3/1994 |
| JP | 06-067119 | 3/1994 |
| JP | 06-289431 | 10/1994 |
| JP | 07-092501 | 4/1995 |
| JP | 08-195357 | 7/1996 |
| JP | 08-234683 | 9/1996 |
| JP | 09-293687 | 11/1997 |
| JP | 10-319907 | 12/1998 |
| JP | 10-339889 | 12/1998 |
| JP | 11-271731 | 10/1999 |
| JP | 2000-221903 | 8/2000 |
| JP | 2000-221907 | 8/2000 |
| JP | 2000-356788 | 12/2000 |
| JP | 2001-191194 | 7/2001 |
| TW | 409293 | 10/2000 |
| WO | WO 00/13213 | 3/2000 |

OTHER PUBLICATIONS

A. Hara et al., *Ultra-High Performance Poly-Si TFTs on a Glass by a Stable Scanning CW Laser Lateral Crystallization*, AM-LCD 2001 Digest of Technical Papers, Jan. 1, 2001, pp. 227-230.

K. Inukai et al., *36.4L: Late-News Paper: 4.0-in. TFT-OLED Displays and a Novel Digital Driving Method*, SID Digest 2000, SID International Symposium Digest of Technical Papers, Jan. 1, 2000, pp. 924-927.

* cited by examiner

FIG. 4
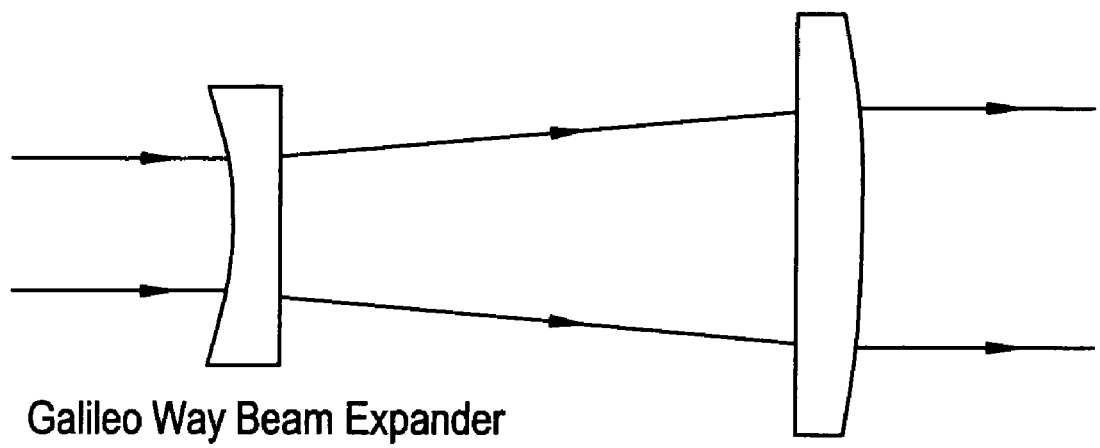
Galileo Way Beam Expander
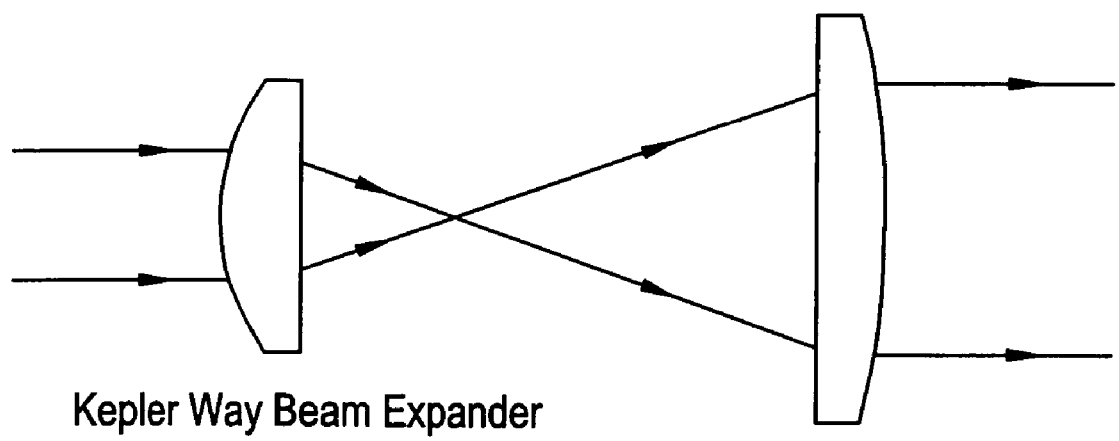
Kepler Way Beam Expander

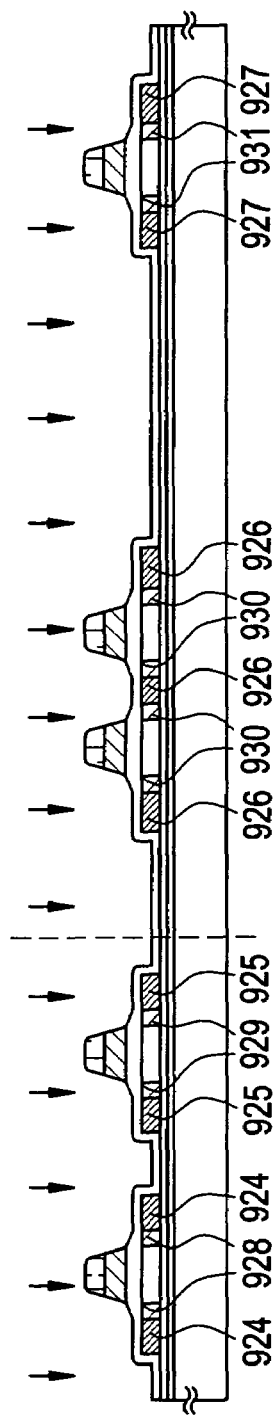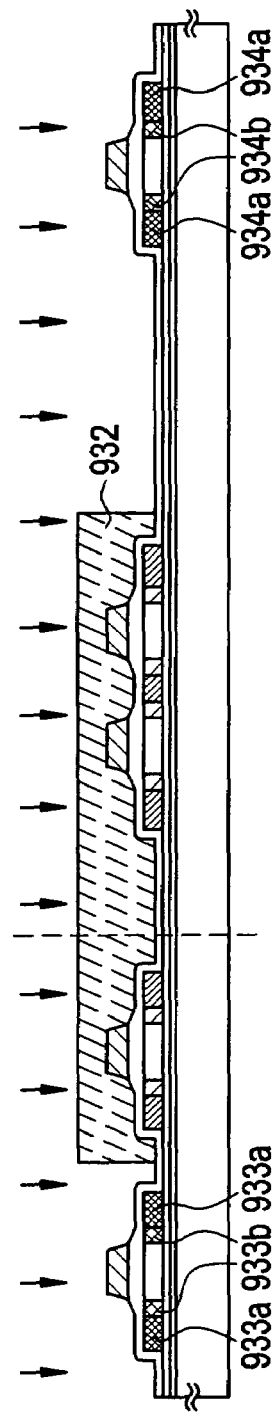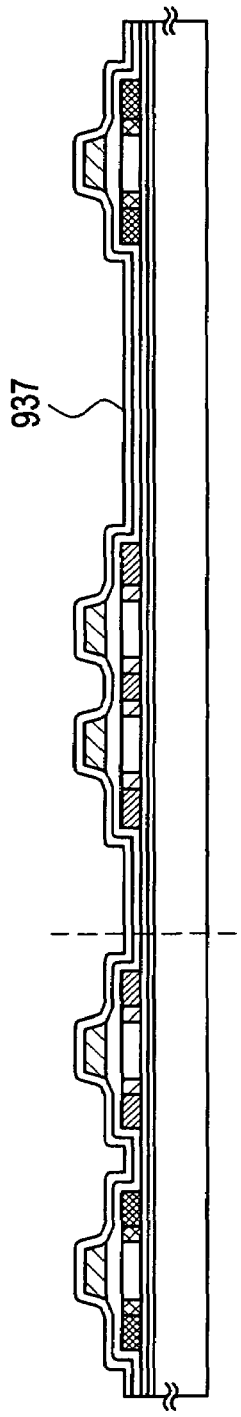

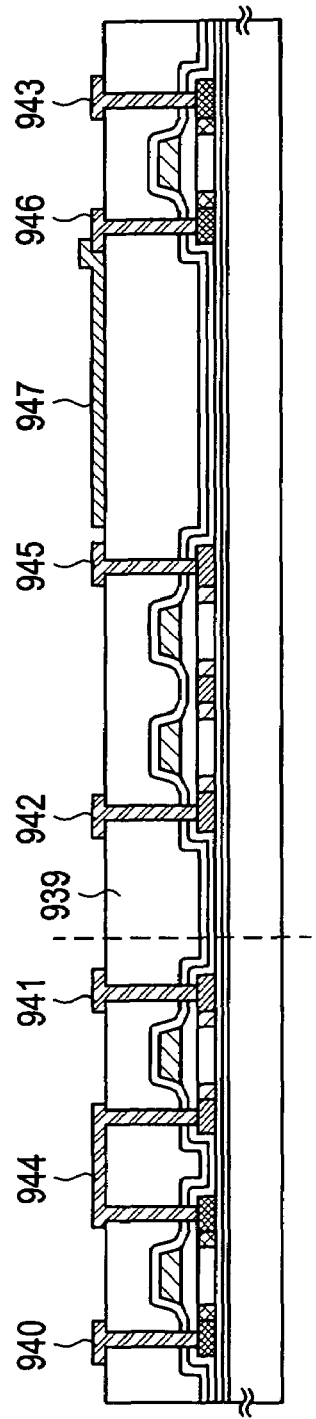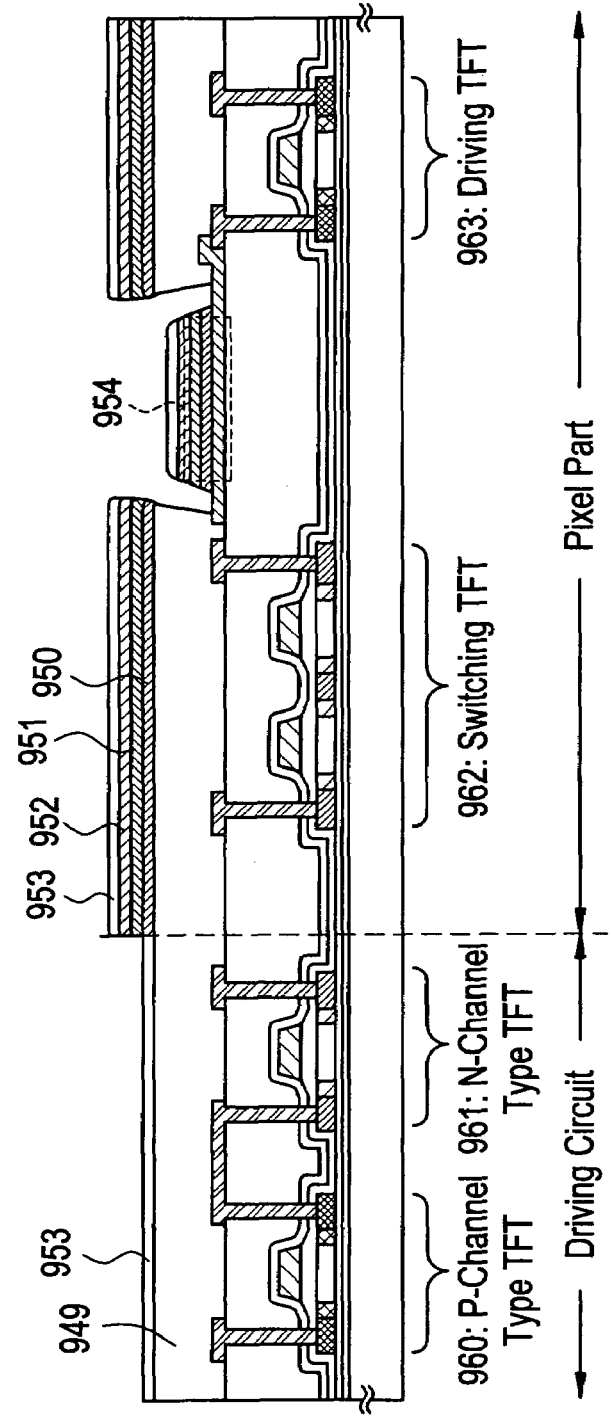

LASER TREATMENT DEVICE, LASER TREATMENT METHOD, AND SEMICONDUCTOR DEVICE FABRICATION METHOD

DETAILED DESCRIPTION OF THE INVENTION

1. Technical Field to Which the Invention Belongs

The present invention relates to a method for annealing a semiconductor film using a laser beam (hereinafter referred to as laser annealing) and a laser irradiation device for performing the laser annealing (devices including a laser and an optical system for guiding a laser beam output from the laser to a member to be processed). Further, the present invention relates to a semiconductor device fabricated by the steps including the laser annealing step and a method for manufacturing the semiconductor device. Note that the semiconductor device mentioned throughout the specification includes an electro-optical device such as a liquid crystal display device and an EL display device.

2. Prior Art

In recent years, development of thin film transistors (hereinbelow referred to as TFTs) has been advanced, and in particular, TFTs employing a polycrystalline silicon film (polysilicon film) as a crystalline semiconductor film has drawn much attention. Especially, in a liquid crystal display device (liquid crystal display) or an EL (electro-luminescence) display device (EL display), these TFTs are used as devices for switching pixels and devices constituting a driver circuit to control the pixels.

A polycrystalline semiconductor film is used for the activation layer of the TFTs. By adding impurities, a source region, drain region and channel are formed in the polycrystalline semiconductor film. In addition, OFFSET regions and LDD regions may be provided.

In common techniques for obtaining a polysilicon film, an amorphous silicon film is crystallized to obtain a polysilicon film. In particular, a method of crystallizing an amorphous silicon film with laser beams has been receiving much attention. In the present specification, the technique for crystallizing an amorphous semiconductor film with laser beams to obtain a crystalline semiconductor film is referred to as laser crystallization.

The laser crystallization enables instantaneous heating of a semiconductor film, and thus it is an effective technique for annealing a semiconductor film formed on a substrate having low heat-resistance, such as a glass substrate, a plastic substrate or the like.

Various kinds of laser beams are available, which can be roughly divided into continuous oscillation type and pulse oscillation type. In respect to the laser crystallization, excellent crystalline properties can be obtained by using the continuous oscillation laser beam, thereby the continuous oscillation laser beam has drawn attention.

Problems to be Solved by the Invention

With respect to thin film transistors formed on one sheet of a substrate, the invention aims to produce thin film transistors satisfying required characteristics all while individually producing them by an innovative optical system of a continuously oscillating type laser.

In a liquid crystal display device and an EL display device, devices for switching pixels and devices composing driving circuits for controlling the pixels are formed in one substrate. These devices are required to have a variety of characteristics corresponding to their roles. However, it is difficult for thin film transistors to satisfy a variety of characteristics required in the case they are produced by a method for obtaining crystalline semiconductor films by evenly radiating continuously oscillating laser to an amorphous silicon film formed entirely on a substrate.

Means for Solving the Problems

Thin film transistors and crystallinity of semiconductor films will be described. Electric properties of thin film transistors greatly depend on the crystallinity of semiconductor films. Specially, the boundaries such as grain boundaries between crystals and other crystals hinder carrier movement. Owing to the hindrance of the movement of carriers, the electric resistance of thin film transistors increases. Accordingly, in order to control the electric properties of thin film transistors, it is required to control the number of the grain boundaries.

The number of grain boundaries can be controlled by the crystal growth direction. The crystal growth direction can not be controlled by carrying out crystallization by heating a substrate, whereas the crystal growth direction can be controlled by laser crystallization because it can carry out local heating and melting.

The growth direction of a crystal of a semiconductor film can be controlled by making the beam shape of laser beam oscillated from a continuously oscillating type laser linear and making the scanning direction coincide with the width direction of the beam. In this case, as shown in FIG. 2, the growth direction of the crystal of the semiconductor film follows the scanning direction of laser beam. The crystal growth direction can be understood from the grain boundary formation direction. Here, it becomes important that the beam is made linear and scanned on an object to be radiated (practically a substrate). Further, the beam shape of laser beam is precisely made to be elliptical or rectangular, however the aspect ratio is high and therefore, here, it is defined as linear. An optical system constituting the invention is illustrated in FIG. 1a and hereinafter, the system will be described.

Oscillated circular laser beam is diffused uniaxially by a cylindrical lens 102. Adjustment of the focal distance by a f-θ lens 104 is made possible to focus (to adjust the focal point of) the laser beam on any position of a substrate. The phrase, to focus (to adjust the focal point on, means to make the linear beam shape and the size on an object to be radiated even on any point of the object to be radiated. The incident light to the f-θ lens 104 can be controlled by a galvanomirror 103. That is, by moving the galvanomirror 103, the radiation position of laser beam can be changed to scan on the substrate. In such a manner, without moving the substrate, laser beam with an elliptical shape (a linear shape) can be scanned on the substrate.

If the energy density of laser beam per unit surface area is required to change, it may be supposedly possible to insert a lens into this optical system, to change the distance of the substrate, and the like. By changing the focal distance of the cylindrical lens 102, the beam shape can be adjusted. Further, the scanning speed can be changed by the galvanomirror 103.

Here, what is important is to rotate the cylindrical lens 102 so as to rotate the linear beam projected to the substrate. Generally, a large number of thin film transistors of active matrix circuits or the like formed on a substrate exist and their orientation, that is, the charge transferring direction, is varied. Accordingly, just like the invention, electric characteristics of the respective thin film transistors on the substrate can be controlled by making the cylindrical lens 102 rotatable and scanning the laser beam in the linear direction (the width direction) in combination to control the crystal growth direction.

BRIEF DESCRIPTION OF DRAWINGS

FIG. 4 shows a beam expander in the Embodiment 3.

FIG. 10 shows a figure showing the fabrication process of TFT of an EL display device.

FIG. 11 shows a figure showing the fabrication process of TFT of an EL display device.

PREFERRED EMBODIMENT OF THE INVENTION

Embodiment 1

One embodiment of the invention will be described. An embodiment of the invention is, with respect to thin film transistors having charge transferring directions in the vertical direction and the transverse direction of the substrate, to fabricate thin film transistors with crystal growth direction coincident with the charge transferring direction.

Figure 1A:
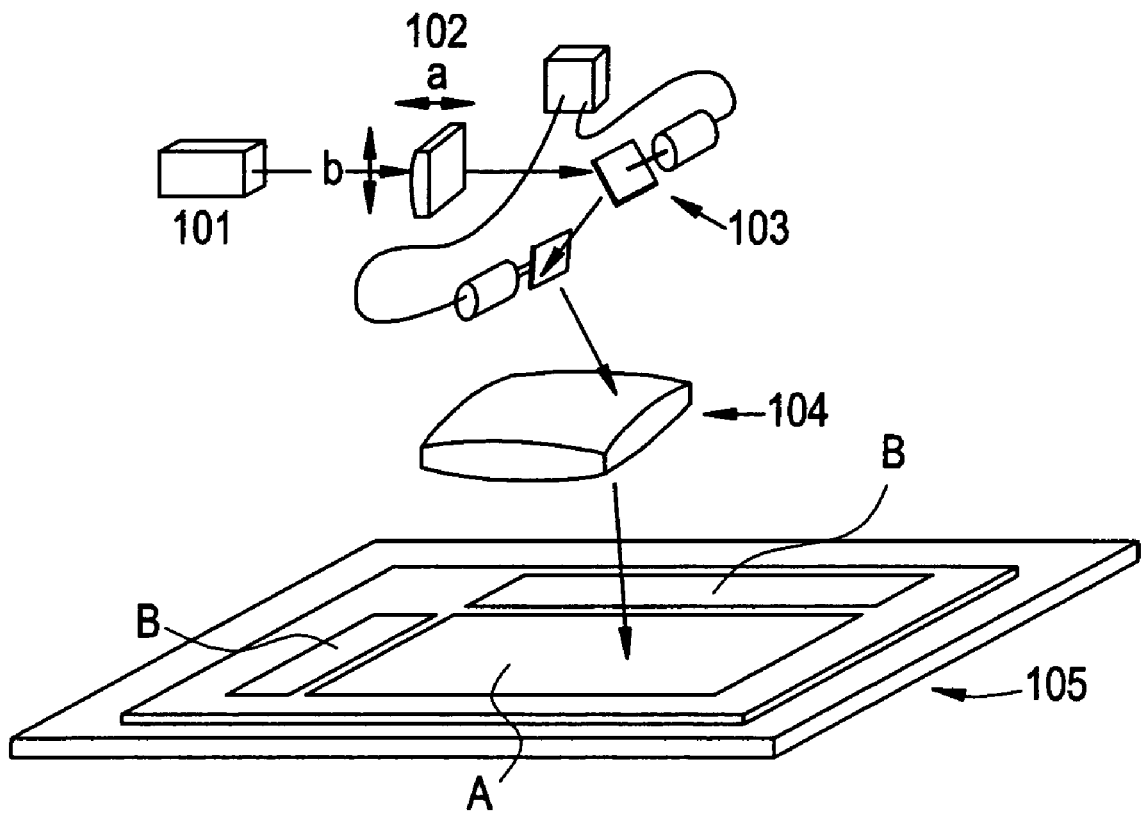
FIG. 1 shows a laser radiation device and a treatment substrate of the invention.
Figure 1B:
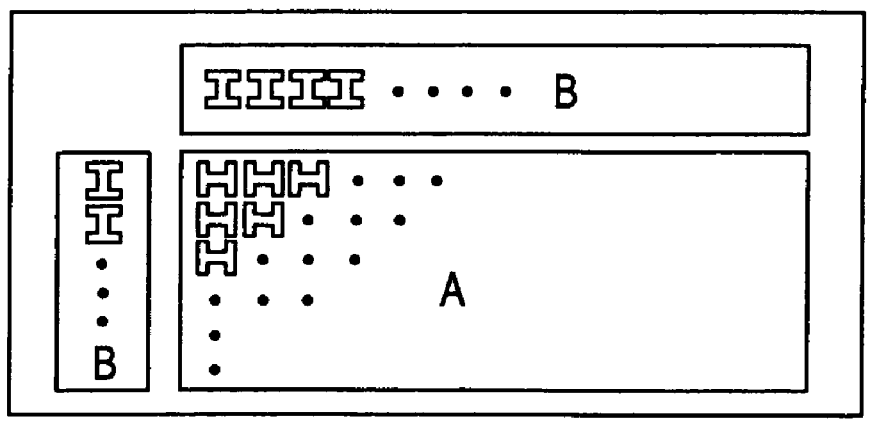
Figure 2:
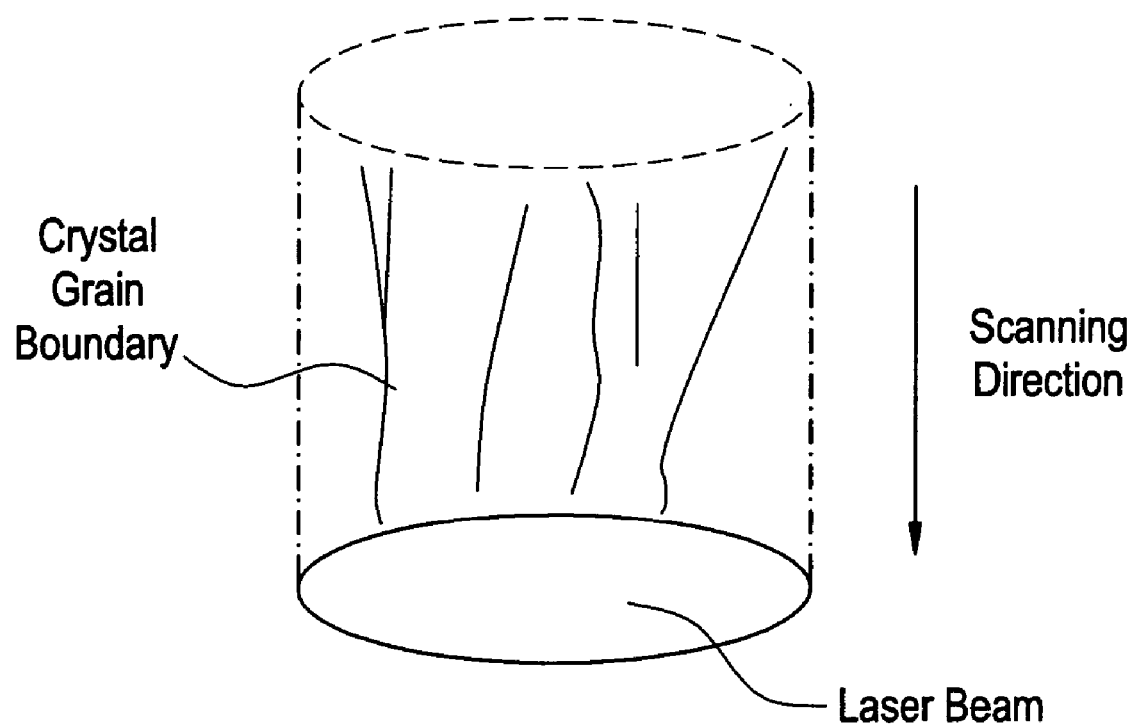
FIG. 2 shows a semiconductor film crystallized by laser beam with elliptical shape.

FIG. 1a shows the constitution of a laser device comprising laser of the invention. It comprises a continuously oscillating type Nd:YVO$_4$ laser 101, a convex cylindrical lens 102 for processing laser beam (second harmonic; wavelength of 532 nm) oscillated from the continuously oscillating Nd:YVO$_4$ laser 101 to be elliptical, a galvanomirror 103 for scanning the laser beam, a f-θ lens 104 for adjusting the focal distance, and a stage 105 for fixing a substrate. The convex cylindrical lens 102 is installed on a rotation stage so as to be rotated optionally. An amorphous silicon film is formed on the substrate and a region A and a region B are formed. FIG. 1b is a top view of the substrate showing there are thin film transistors which have a charge transferring direction in the transverse direction of the substrate and are to be formed in the region A and thin film transistors which have a charge transferring direction in the vertical direction of the substrate and are to be formed in the region B.

In this case, the output power of laser is 10 W. The laser beam shape is an ellipse with a length of 20 μm in the minor axis direction and a length of 400 μm in the major axis direction. The scanning speed is 20 cm/s. Melting of a semiconductor film depends on the energy density per unit surface area. Accordingly, if energy density is similar to that described above, the shape or the size of the laser beam may be changed.

With such a constitution, laser beam is radiated to an amorphous silicon film. In the region A, the power direction of the convex cylindrical lens 102 is set to be in (a) direction by a rotation stage (details not illustrated) and laser beam is scanned in the transverse direction of the substrate by the galvanomirror 103. On the other hand, in the region B, the power direction of the convex cylindrical lens 102 is set to be in (b) direction at an angle of 90° turned from the (a) direction by the rotation stage and laser beam is scanned in the vertical direction of the substrate.

Figure 3A:
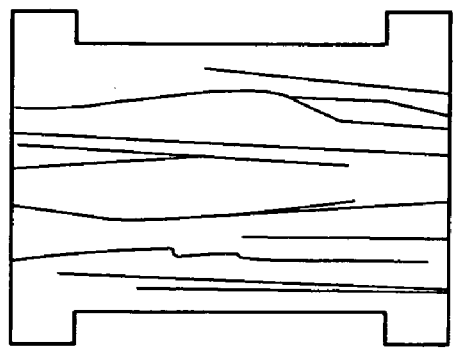
FIG. 3 shows thin film transistors with controlled crystal growth direction.
Figure 3B:
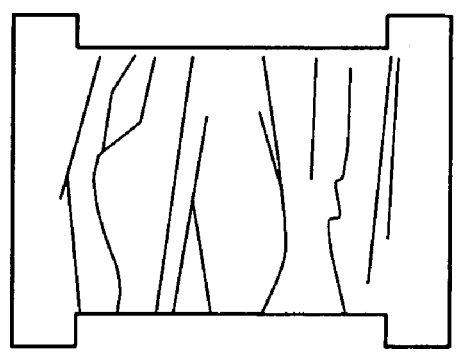

By doing that, thin film transistors with the even laser beam scanning direction, that is, the crystal growth direction parallel to the charge transferring direction, can be fabricated. The thin film transistors fabricated by such a manner have crystal grain boundaries shown in FIG. 3a. Incidentally, the crystal grain is a single crystal. Depending on the electric characteristic which the thin film transistors are required to have, the laser beam scanning direction, that is, the crystal growth direction may be perpendicular to the charge transferring direction. In the case of making the directions perpendicular, since a plurality of grain boundaries exist in the charge transferring direction of the thin film transistors as shown in FIG. 3b, the mobility of carriers is decreased. However, there is an advantage that the leak current can be decreased in off-state of switches of the thin film transistors.

Further, the laser beam is scanned by the galvanomirror 103 and the laser beam shape can be controlled by the convex cylindrical lens 102, so that crystallization can be carried out without moving the substrate.

Embodiment 2

Another embodiment different from the Embodiment 1 will be explained. This embodiment is, with respect to thin film transistors having charge transferring directions in the vertical direction and the transverse direction of the substrate, to fabricate thin film transistors with crystal growth direction different from the charge transferring direction and uniform electric characteristics. An optical system and a substrate with the same constitutions as those shown in FIGS. 1a and 1b are employed.

The convex cylindrical lens 102 installed in the rotation stage is set at 45° between (a) and (b). When laser beam is oscillated with such a constitution, elliptical shape is projected in the diagonal direction to the substrate. When the laser beam is scanned in the minor axis direction, the crystal growth takes place in the direction at 45° from the vertical direction or the transverse direction.

Figure 3C:
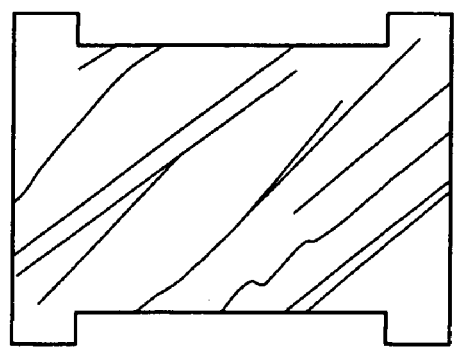

From the substrate crystallized in such a manner, thin film transistors as shown in FIG. 3c are to be fabricated. The thin film transistors having the charge transferring direction in the vertical direction of the substrate and the thin film transistors having the charge transferring direction in the transverse direction of the substrate are to have approximately the same number of grain boundaries crossing the charge transferring direction, so that the electric characteristics become uniform.

Figure 12:
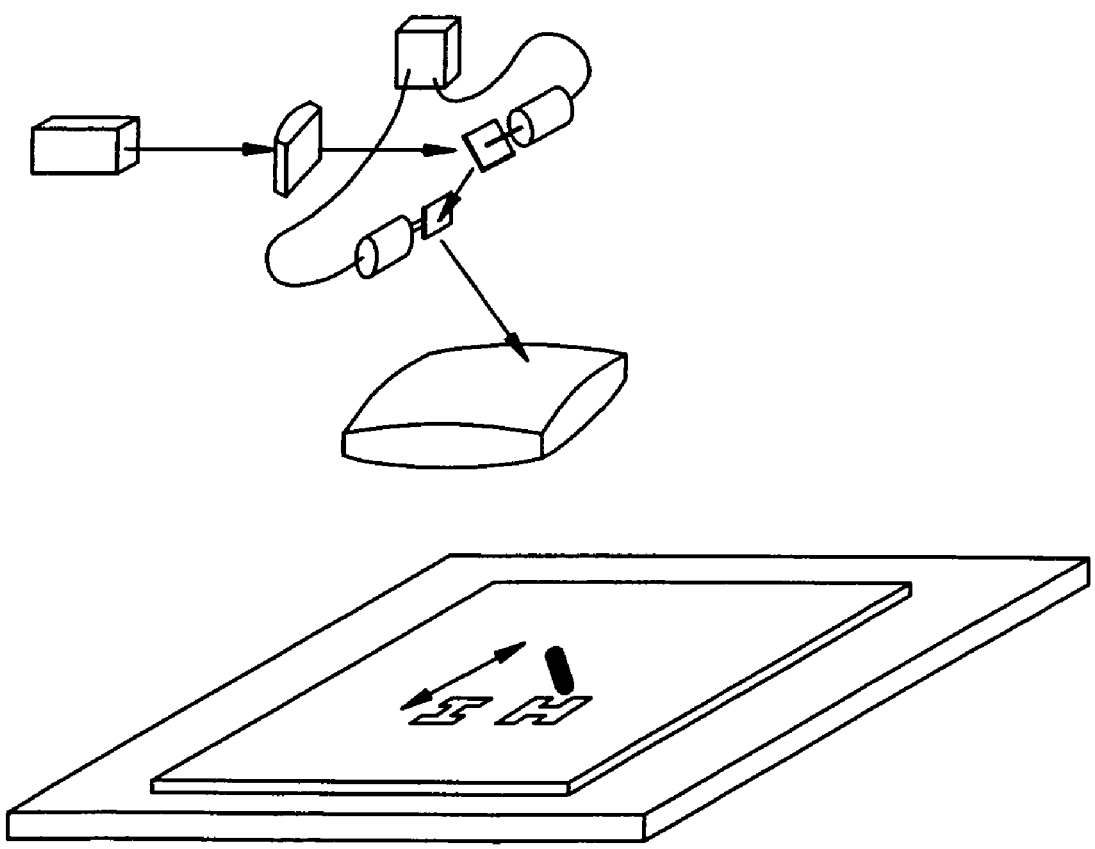
FIG. 12 shows a laser radiation device and a treatment substrate of the invention.

As shown in FIG. 12, in the case where thin film transistors are to be formed alternatively in vertical and transverse directions to make the characteristics united, the method also can be applied.

Further, depending on the size and shape of the thin film transistors, the angle of the cylindrical lens is not necessarily set at 45°. Since it is only required to make electric characteristics of the thin film transistors uniform, the cylindrical lens may be rotated between 0° and 90° and scanning is carried out in the minor axis direction. The crystal growth direction of the semiconductor film to be employed for the thin film transistors formed in such a manner are not parallel to the vertical direction and the transverse direction but a diagonal direction.

Embodiment 3

In this embodiment, an optical system with which the optical adjustment is made easy to carry out at the time of making the beam shape elliptical will be described. In the Embodiments 1 and 2, the convex cylindrical lens for forming the elliptical shape is one in number. On the other hand, in this embodiment, two lenses are employed.

There is a Galileo way and a Kepler way as the methods for magnifying or reducing a beam by two lenses. The Galileo way is a method for changing the beam size using a concave lens and a convex lens as shown in FIG. 4. On the other hand, the Kepler way is a method for changing the beam size using two convex lenses as shown in FIG. 4.

If the lenses are changed to cylindrical lenses, the beam can be magnified or reduced only in one axis direction and the ratio of the major axis and the minor axis can be easily adjusted. Nevertheless, the two cylindrical lenses are required to be even in the axis direction. Accordingly, they have to be moved simultaneously at the time of rotating them on the rotation stage or the like.

Other than cylindrical lenses, two pairs of prisms may be used for magnification or reduction only in one axis direction. Besides these, those having equivalent function may be also employed.

Embodiment 4

In this embodiment, an optical system for making the length in the minor axis direction further shorter will be described. The width of laser beam at the focal point converged by a lens is determined on the basis of the focal distance of the lens and the spread angle of the laser. Laser beam has wavefront in Laplace-Gauss distribution and because of that, the beam diameter becomes wide at the focal point. Accordingly, in this embodiment, a computer hologram for making parallel the wavefront in Laplace-Gauss distribution is introduced into the optical system. If the wavefront is parallel, the beam width at the focal point can be narrowed in Laplace-Gauss distribution.

The computer hologram is effective to be inserted before the lens. Accordingly, in the case shown in FIG. 1*a*, it is inserted before the cylindrical lens 102. In the case that radiation with the same laser power is carried out, when making the length in the minor axis direction shorter, the length of the elliptical shape in the major axis direction can be extended. Consequently, the number of scanning times per unit surface area can be decreased to result in a speedup of the substrate treatment.

Embodiment 5

In this embodiment, a device actually required for carrying out radiation to a substrate will be described. As shown in FIG. 1*a*, in the case beam is scanned on the substrate by a galvanomirror, the beam radiated in the substrate center is reflected and turned back to the laser device. This return laser beam causes damages on harmonic conversion devices. Accordingly, in order to avoid that, a device such as an isolator, which allows only beam in one direction to pass, is introduced into the optical system.

In the FIG. 1*a*, it is effective to be inserted before the cylindrical lens where the laser beam shape is not changed.

The foregoing computer hologram may be employed in combination in optional arrangement order.

Embodiment 6

In this embodiment, another device different from that for the Embodiment 5 and required for actually carrying out radiation to the substrate will be described. The laser beam to be scanned on a substrate melts the substrate if it is radiated to the substrate for a long duration because of the high energy density. Accordingly, in the case that the laser beam scanning is stopped due to a cause such as a trouble of a galvanomirror or the like, the radiation to the substrate has to be stopped. Therefore, in this invention, an interlock is installed in front of the galvanomirror. The interlock starts operation and shuts the beam by a metal plate or the like when abnormality is detected or a trouble of the galvanomirror is detected by a sensor installed on a stage.

Embodiment 7

In this embodiment, another device different from those of Embodiments 5 and 6 and required for actually carrying out radiation to the substrate will be described. Since the laser beam to be scanned on a substrate is extremely intense, even the reflected light and transmitted light which are not absorbed in an amorphous silicon film cause damage in the circumference. Accordingly, in order to prevent diffusion of such light, a chamber or a damper is required to be installed in the surrounding of the substrate.

Embodiment 8

Figure 5:
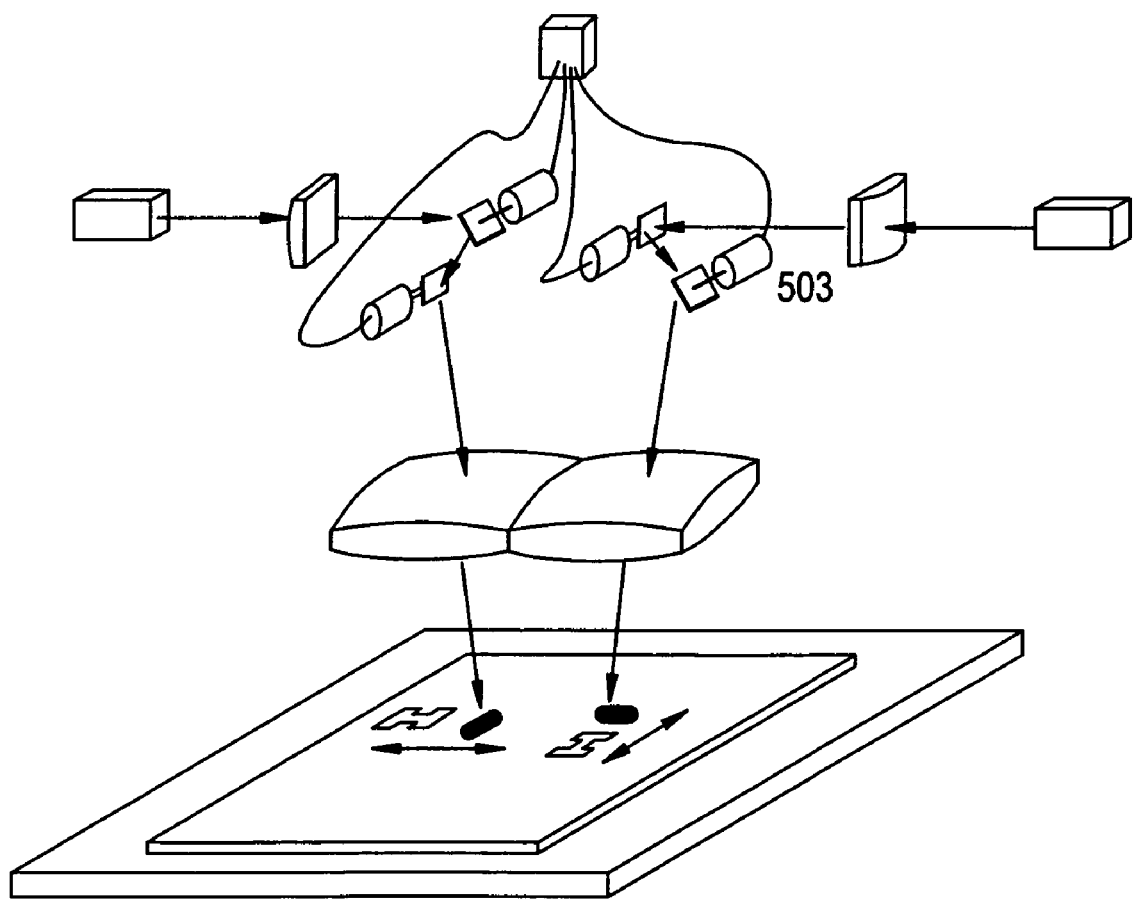
FIG. 5 shows a laser radiation device of the invention in the Embodiment 8.

In this embodiment, an optical system required for mass production system will be described. As shown in FIG. 5, it is for simultaneously scanning of laser beam from two light sources by controlling a galvanomirror 503 with one controller. By doing that, the throughput of the laser crystallization can be increased by two times.

Figure 6:
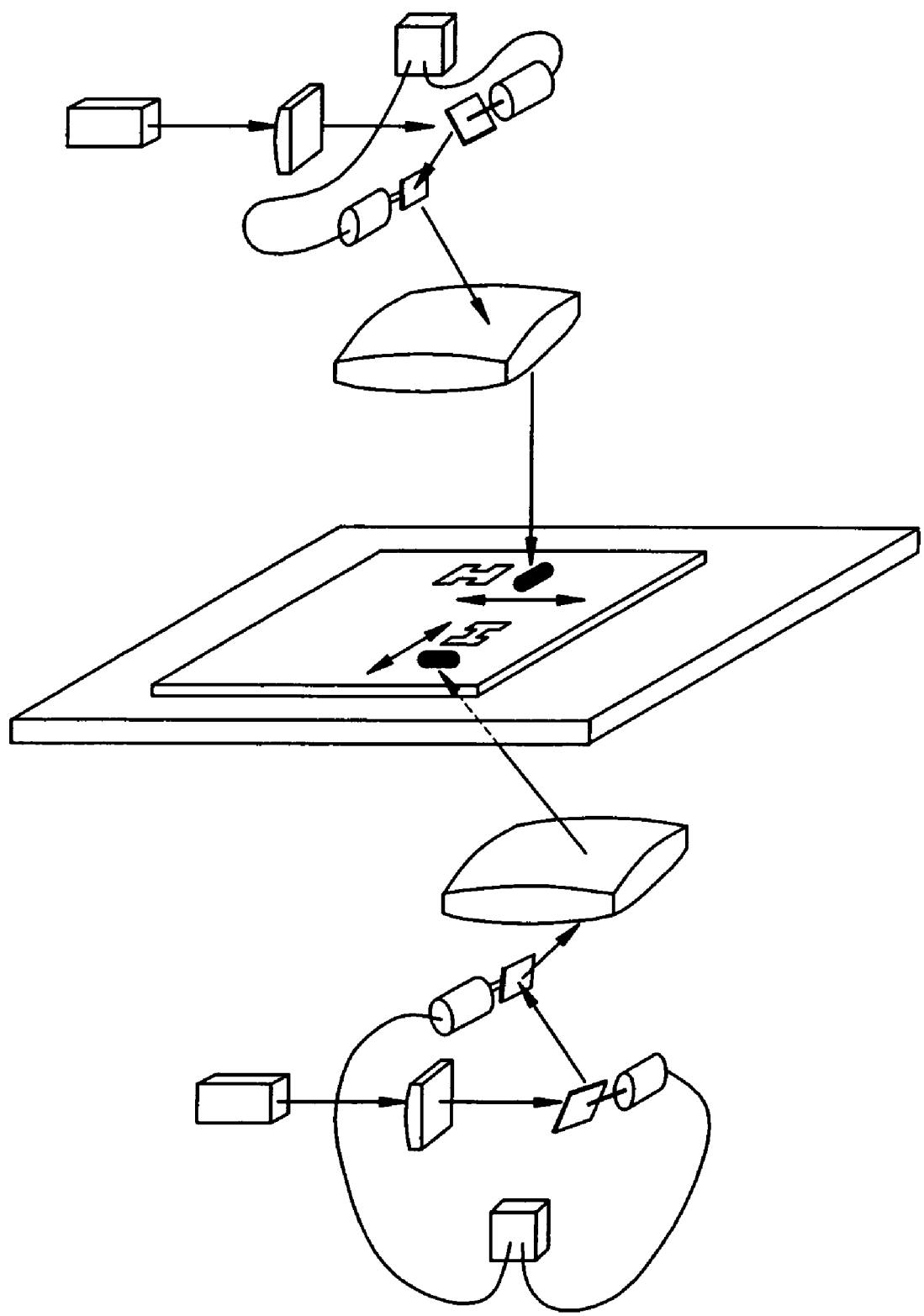
FIG. 6 shows a laser radiation device of the invention in the Embodiment 8.

As another method for simultaneous scanning of laser beam from two sources, as shown in FIG. 6, laser beam is radiated from the front side of a substrate and another kind of laser beam is radiated from the rear side of the substrate. However, the substrate and the stage are required to transmit laser beam.

The invention includes combinations of any of the Embodiments 1 to 8. Further, although laser beam is radiated to the front side of the amorphous silicon film in the Embodiments 1 to 8, if the laser beam has wavelength proper to be transmitted through the substrate and absorbed in semiconductor films, it can be radiated from the rear side of the substrate.

EXAMPLES

Example 1

Figure 7:
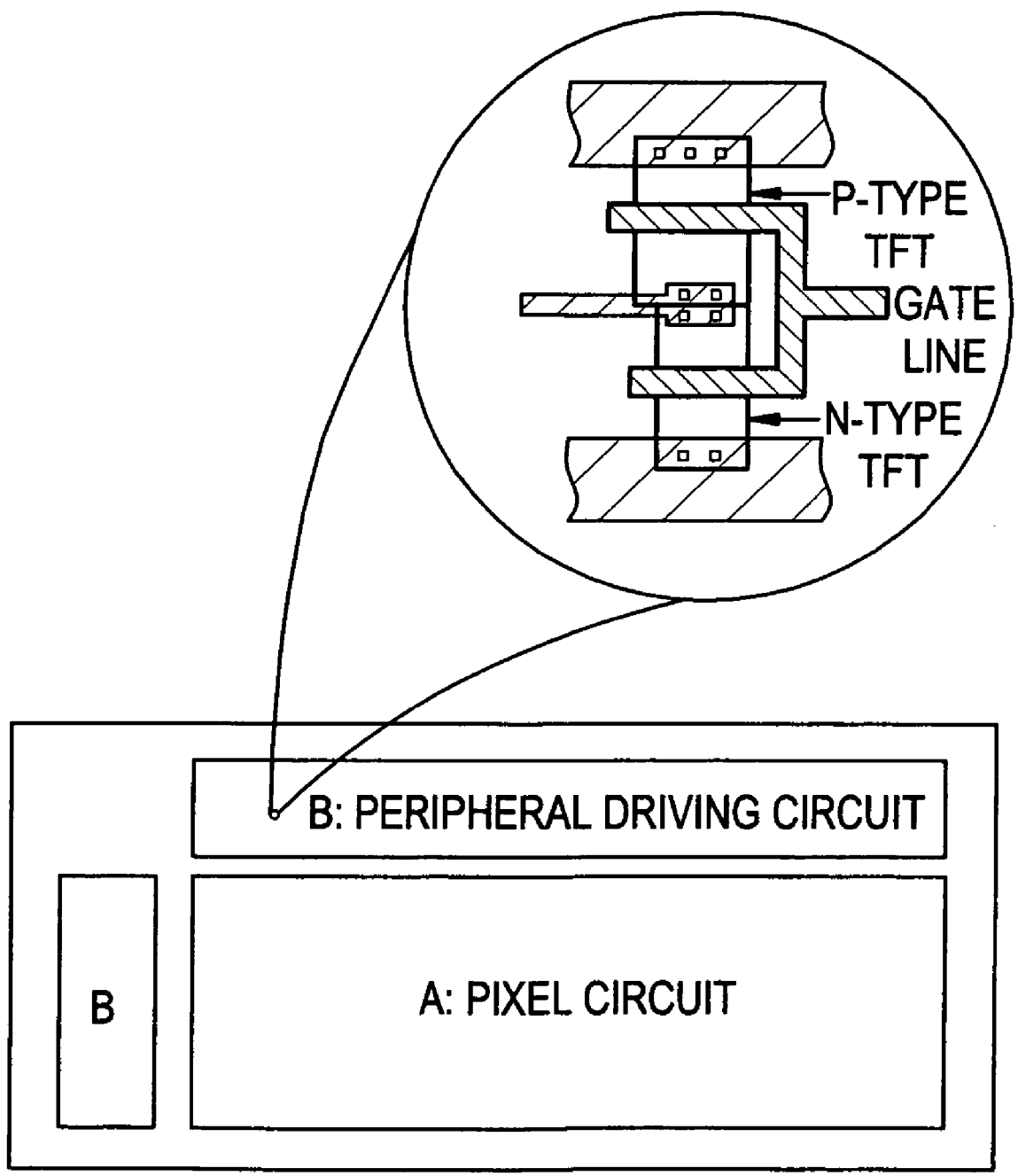
FIG. 7 shows an EL display device bearing peripheral driving circuits and pixel circuits of Example 1.

Described with reference to FIGS. 9 to 11 is an example of the present invention. This example describes a method for manufacturing TFTs having its charge transferring direction in the vertical direction and the transverse direction of a substrate. FIG. 7 is a top view of an EL display device in which a peripheral driving circuit and a pixel circuit are formed on one substrate. The TFTs having its charge transferring direction in the vertical direction of the substrate and the TFTs having its charge transferring direction in the transverse direction of the substrate are mixed to constitute a peripheral driving circuit. The above view of FIG. 7 illustrates the TFTs constituting an inverter circuit, which is a part of the peripheral driving circuit, and the TFTs having its charge transferring direction in the vertical direction are formed. On the other hand, the pixel circuit has a constitution where plural pixels are formed in matrix, a state shown in FIG. 8 can be obtained by enlarging one part thereof. The pixel thereof is constituted only by the TFTs having its charge transferring direction in the transverse direction.

Here, a detailed description of manufacturing switching TFTs and driving TFTs that constitute the pixel circuit and the TFTs constituting the inverter circuit of the peripheral circuit at the same time will be shown in accordance with the process. Further, since the erasing TFTs can be fabricated simultaneously with the switching TFTs, therefore, the description is omitted.

In FIG. 9, for the substrate 900, other than a glass substrate made of glass such as barium borosilicate glass or aluminoborosilicate glass as represented by the glass #7059 or the glass #1737 of Corning Co., a quartz substrate, a plastic substrate using polyethyleneterephthalate, polyethylenenaphthalate, polyethersulfone and the like may be used.

In order to prevent impurities diffusion from the substrate 900, on the surface of the substrate 900 on which the TFT is to be formed, an underlying film 901 comprising an insulating film such as silicon oxide film, silicon nitride film or silicon oxynitride film is formed. In this example, the underlying film 901 has a two-layer structure. There, however, may be employed a structure in which a single layer or two or more layers are laminated on the insulating film. The first layer of the underlying film 901 is a silicon oxynitride film 901a formed maintaining a thickness of from 10 to 200 nm (preferably, from 50 to 100 nm) relying upon a plasma CVD method by using $SiH_4$, $NH_3$ and $N_2O$ as reaction gases. In this example, the silicon oxynitride film 901a (having a composition ratio of Si=32%, O=27%, N=24%, H=17%) is formed maintaining a thickness of 50 nm. The second layer of the underlying film 901 is a silicon oxynitride film 901b formed maintaining a thickness of from 50 to 200 nm (preferably, from 100 to 150 nm) relying upon the plasma CVD method by using $SiH_4$ and $N_2O$ as reaction gases. In this example, the silicon oxynitride film 901b (having a composition ratio of Si=32%, O=27%, N=24%, H=17%) is formed maintaining a thickness of 100 nm.

Then, an amorphous semiconductor film 903 is formed maintaining a thickness of 25 to 150 nm (preferably 30 to 60 nm) by a known method such as a plasma CVD method, LPCVD method, sputtering method and the like. There is no limitation on the material of the semiconductor film, however, there is preferably used silicon or a silicon-germanium ($Si_xGe_{1-x}$ (X=0.0001 to 0.02)) alloy thereto. In this example, the amorphous silicon film is formed maintaining a thickness of 55 nm relying on the plasma CVD method.

Figure 8:
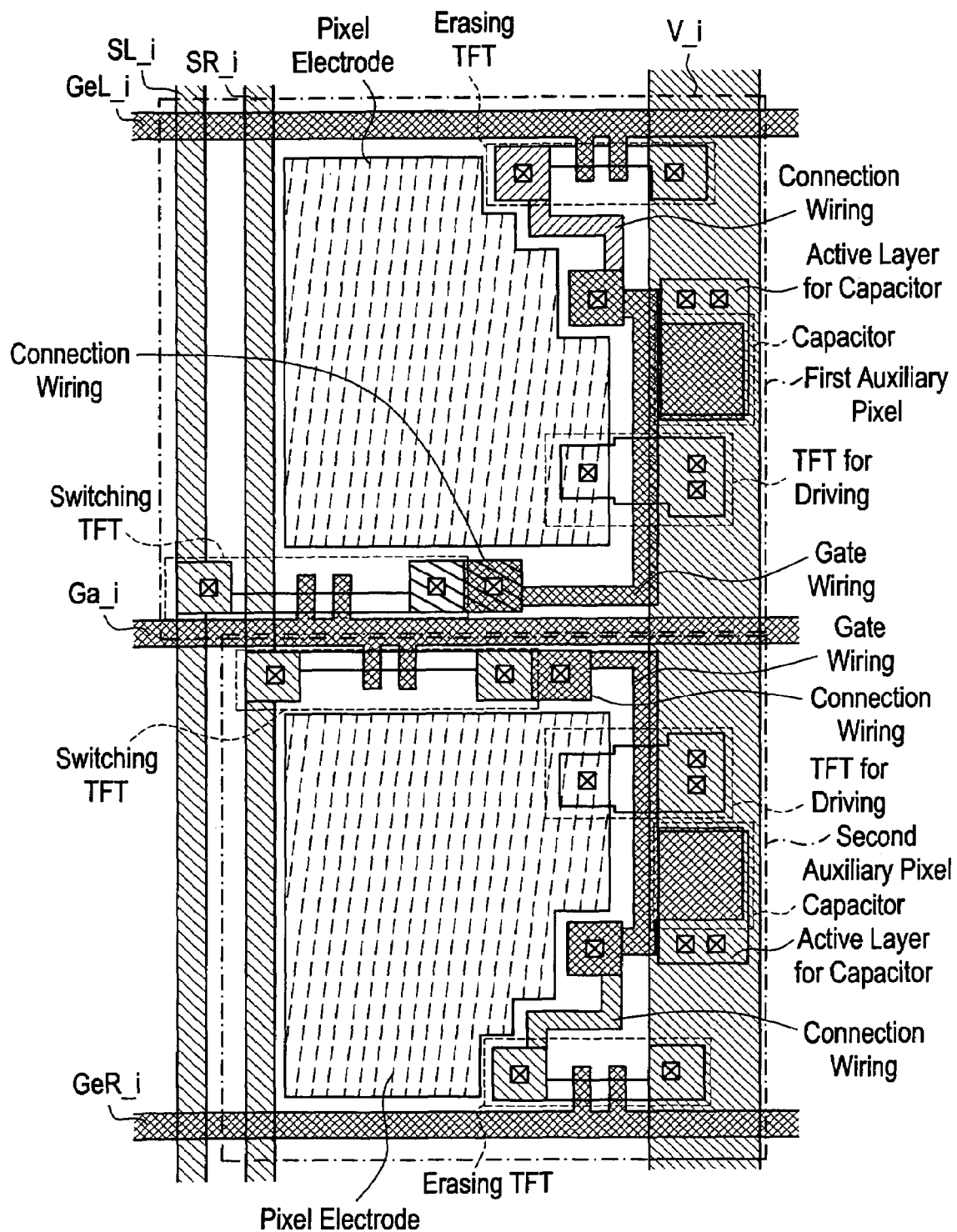
FIG. 8 shows a magnified figure of the pixel circuits of Example 1.
Figure 9A:
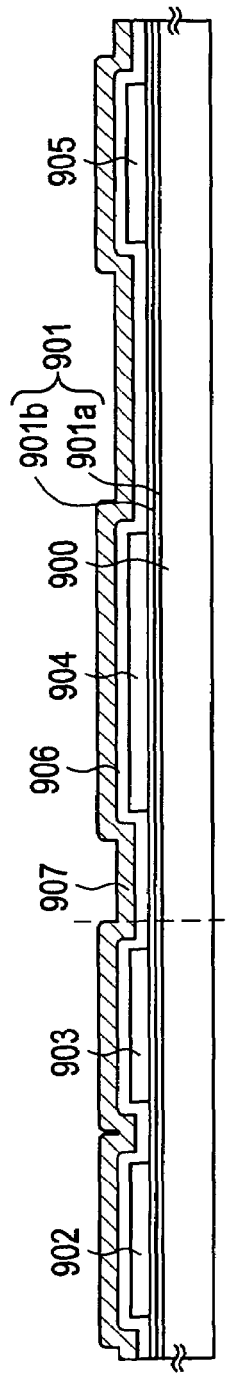
FIG. 9 shows a figure showing the fabrication process of TFT of an EL display device.
Figure 9B:
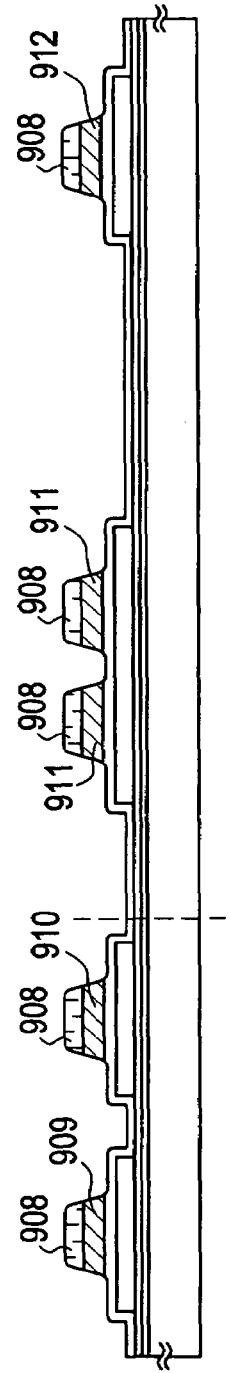
Figure 9C:
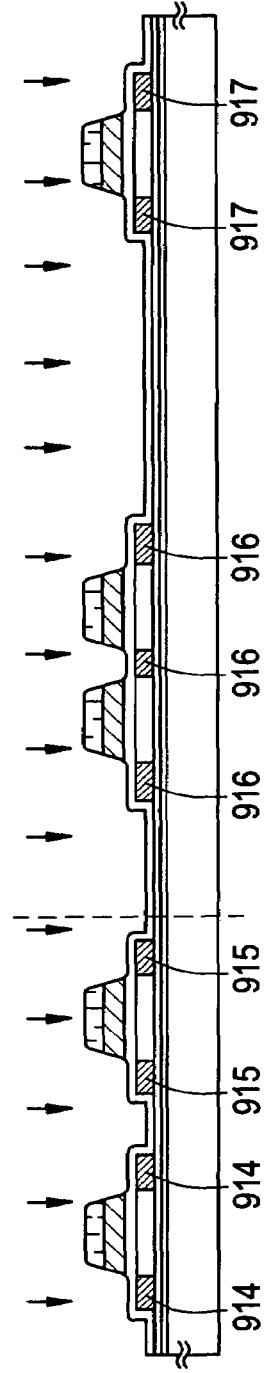
Figure 9D:
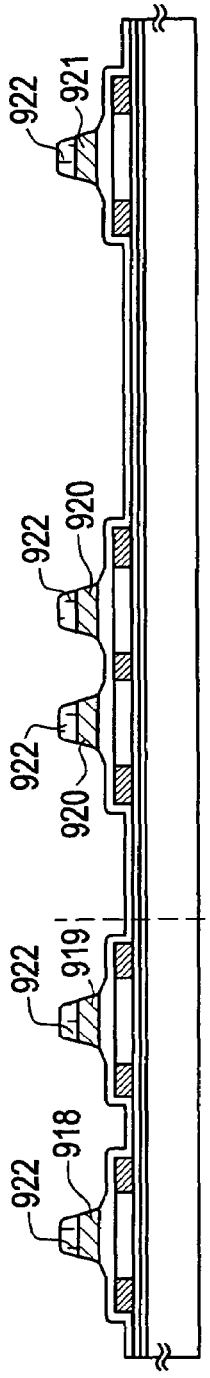

The amorphous silicon film on the substrate is irradiated from the above direction by a laser irradiation device as shown in FIG. 1A. Region A is the pixel circuit, as shown in FIG. 8, where the TFTs having its charge transferring direction in the transverse direction are formed. Here, cylindrical lens are set to be in "a" direction, and the laser beam is irradiated in the transverse direction of the substrate by a galvanomirror.

Here, in the pixel circuit, although thin film transistors with the even laser scanning direction, that is, the crystal growth direction parallel to the charge transferring direction, is fabricated, depending on the electric characteristics which the thin film transistors are required to have, the laser beam scanning direction perpendicular, that is, the crystal growth direction perpendicular to the charge transferring direction. In the case of making the directions perpendicular, since a plurality of grain boundaries exist in the charge transferring direction of the thin film transistors as shown in FIG. 3b, the mobility of carriers is decreased. However, there is an advantage that the leak current can be decreased in off-state of switches of the thin film transistors.

On the hand, Region B is the peripheral driving circuit, which is formed by mixing the TFTs having its charge transferring direction in the vertical direction of the substrate and the TFTs having its charge transferring direction in the transverse direction of the substrate. Here, the cylindrical lens is set at 45° between (a) and (b), the laser beam is scanned in the diagonal direction of the substrate by the galvanomirror, in the strict sense, in the minor axis direction of the beam of an elliptical shape projected in the substrate.

Both the TFTs having its charge transferring direction in the vertical direction of the substrate and the TFTs having its charge transferring direction in the transverse direction of the substrate exist in the peripheral driving circuit. However, since identical frequency is required in the circuit, electric characteristics of the respective thin film transistors on the substrate need to be uniformed. Accordingly, as described above, scanning is performed at 45° of the vertical direction or the transverse direction of the substrate. In addition, the angle of the cylindrical lens can be adjusted depending on the arrangement of the circuit.

The crystalline silicon film is patterned by a photolithographic method to form semiconductor layers 902 to 905.

The semiconductor layers 902 to 905 that have been formed may further be doped with trace amounts of an impurity element (boron or phosphorus) to control the threshold value of the TFT.

Then, a gate insulating film 906 is formed to cover the semiconductor layers 902 to 905. The gate insulating film 906 is formed of an insulating film containing silicon maintaining a thickness of from 40 to 150 nm by the plasma CVD method or the sputtering method. In this example, the gate insulating film is formed of a silicon oxynitride film (composition ratio of Si=32%, O=59%, N=7%, H=2%) maintaining a thickness of 110 nm by the plasma CVD method. The gate insulating film is not limited to the silicon oxynitride film but may have a structure on which is laminated a single layer or plural layers of an insulating film containing silicon.

When the silicon oxide film is to be formed, TEOS (tetraethyl orthosilicate) and $O_2$ are mixed together by the plasma CVD method, and are reacted together under a reaction pressure of 40 Pa, at a substrate temperature of from 300 to 400° C., at a frequency of 13.56 MHz and a discharge electric power density of from 0.5 to 0.8 $W/cm^2$. The thus formed silicon oxide film is, then, heat annealed at 400 to 500° C. thereby to obtain the gate insulating film having good properties.

Then, a heat resistant conductive layer 907 is formed on the gate insulating film 906 maintaining a thickness of from 200 to 400 nm (preferably, from 250 to 350 nm) to form the gate electrode. The heat-resistant conductive layer 907 may be formed as a single layer or may, as required, be formed in a structure of laminated layers of plural layers such as two layers or three layers. The heat resistant conductive layer contains an element selected from Ta, Ti and W, or contains an alloy of the above element, or an alloy of a combination of the above elements. The heat-resistant conductive layer is formed by the sputtering method or the CVD method, and should contain impurities at a decreased concentration to decrease the resistance and should, particularly, contain oxygen at a concentration of not higher than 30 ppm. In this example, the W film may be formed by the sputtering method by using W as a target, or may be formed by the hot CVD method by using tungsten hexafluoride ($WF_6$). In either case, it is necessary to decrease the resistance so that it can be used as the gate electrode. It is, therefore, desired that the W film has a resistivity of not larger than 20 $\mu\Omega$cm. The resistance of the W film can be decreased by coarsening the crystalline particles. When W contains much impurity elements such as oxygen, the crystallization is impaired and the resistance increases. When the sputtering method is employed, therefore, a W target having a purity of 99.999% or 99.99% is used, and the W film is formed while giving a sufficient degree of attention so that the impurities will not be infiltrated from the gaseous phase during the formation of the film, to realize the resistivity of from 9 to 20 $\mu\Omega$cm.

On the other hand, the Ta film that is used as the heat-resistant conductive layer 907 can similarly be formed by the sputtering method. The Ta film is formed by using Ar as a sputtering gas. Further, the addition of suitable amounts of Xe and Kr into the gas during the sputtering makes it possible to relax the internal stress of the film that is formed and to prevent the film from being peeled off. The Ta film of $\alpha$-phase has a resistivity of about 20 $\mu\Omega$cm and can be used as the gate electrode but the Ta film of $\beta$-phase has a resistivity of about 180 $\mu\Omega$cm and is not suited for use as the gate electrode. The TaN film has a crystalline structure close to the $\alpha$-phase. Therefore, if the TaN film is formed under the Ta film, there is easily formed the Ta film of $\alpha$-phase. Further, though not diagramed, formation of the silicon film doped with phosphorus (P) maintaining a thickness of about 2 to about 20 nm under the heat resistant conductive layer 907 is effective in fabricating the device. This helps improve the intimate adhesion of the conductive film formed thereon, prevent the oxidation, and prevent trace amounts of alkali metal elements contained in the heat resistant conductive layer 907 from being diffused into the gate insulating film 906 of the first shape. In any way, it is desired that the heat-resistant conductive layer 907 has a resistivity over a range of from 10 to 50 $\mu\Omega$cm.

Next, a mask 908 is formed by a resist relying upon the photolithographic technology. Then, a first etching is executed. This example uses an ICP etching device, uses $Cl_2$ and $CF_4$ as etching gases, and forms a plasma with RF (13.56 MHz) electric power of 3.2 W/cm$^2$ under a pressure of 1 Pa. The RF (13.56 MHz) electric power of 224 mW/cm$^2$ is supplied to the side of the substrate (sample stage), too, whereby a substantially negative self bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The conductive layers 909 to 913 having a first tapered shape are formed by the first etching treatment. The conductive layers 909 to 913 are tapered at an angle of from 15 to 30°. To execute the etching without leaving residue, over-etching is conducted by increasing the etching time by about 10 to 20%. The selection ratio of the silicon oxynitride film (gate insulating film 906) to the W film is 2 to 4 (typically, 3). Due to the over etching, therefore, the surface where the silicon oxynitride film is exposed is etched by about 20 to about 50 nm (FIG. 9 (B)).

Then, a first doping treatment is effected to add an impurity element of a first type of electric conduction to the semiconductor layer. Here, a step is conducted to add an impurity element for imparting the n-type. A mask 908 forming the conductive layer of a first shape is left, and an impurity element is added by the ion-doping method to impart the n-type in a self-aligned manner with the conductive layers 909 to 913 having a first tapered shape as masks. The dosage is set to be from $1\times10^{13}$ to $5\times10^{14}$ atoms/cm$^2$ so that the impurity element for imparting the n-type reaches the underlying semiconductor layer penetrating through the tapered portion and the gate insulating film 906 at the ends of the gate electrode, and the acceleration voltage is selected to be from 80 to 160 keV. As the impurity element for imparting the n-type, there is used an element belonging to the Group 15 and, typically, phosphorus (P) or arsenic (As). Phosphorus (P) is used, here. Due to the ion-doping method, an impurity element for imparting the n-type is added to the first impurity regions 914 to 917 over a concentration range of from $1\times10^{20}$ to $1\times10^{21}$ atoms/cm$^3$ (FIG. 9(C)).

In this step, the impurities turn down to the lower side of the conductive layers 909 to 912 of the first shape depending upon the doping conditions, and it often happens that the first impurity regions 914 to 917 are overlapped on the conductive layers 909 to 912 of the first shape.

Next, the second etching treatment is conducted as shown in FIG. 9 (D). The etching treatment, too, is conducted by using the ICP etching device, using a mixed gas of $CF_4$ and $Cl_2$ as an etching gas, using an RF electric power of 3.2 W/cm$^2$ (13.56 MHz), a bias power of 45 mW/cm$^2$ (13.56 MHz) under a pressure of 1.0 Pa. Under this condition, there are formed the conductive layers 918 to 921 of a second shape. The end portions thereof are tapered, and the thickness gradually increases from the ends toward the inside. The rate of isotropic etching increases in proportion to a decrease in the bias electricity applied to the side of the substrate as compared to the first etching treatment, and the angle of the tapered portions becomes 30 to 60°. The mask 908 is etched at the edge by etching to form a mask 922. In the step of FIG. 9 (D), the surface of the gate insulating film 906 is etched by about 40 nm.

Then, the doping is effected with an impurity element for imparting the n-type under the condition of an increased acceleration voltage by decreasing the dosage to be smaller than that of the first doping treatment. For example, the acceleration voltage is set to be from 70 to 120 keV, the dosage is set to be $1\times10^{13}$/cm$^2$ thereby to form first impurity regions 924 to 927 having an increased impurity concentration, and second impurity regions 928 to 931 that are in contact with the first impurity regions 924 to 927. In this step, the impurity may turn down to the lower side of the conductive layers 918 to 921 of the second shape, and the second impurity regions 928 to 931 may be overlapped on the conductive layers 918 to 921 of the second shape. The impurity concentration in the second impurity regions is from $1\times10^{16}$ to $1\times10^{18}$ atoms/cm$^3$ (FIG. 10 (A)).

Referring to FIG. 10 (B), impurity regions 933 (933a, 933b) and 934 (934a, 934b) of the conduction type opposite to the one conduction type are formed in the semiconductor layers 902, 905 that form the p-channel TFTs. In this case, too, an impurity element for imparting the p-type is added using the conductive layers 918 and 921 of the second shape as masks to form impurity regions in a self-aligned manner. At this moment, the semiconductor layers 903 and 904 forming the n-channel TFTs are entirely covered for their surfaces by forming a mask 932 of a resist. Here, the impurity regions 933 and 934 are formed by the ion-doping method by using diborane ($B_2H_6$). The impurity element for imparting the p-type is added to the impurity regions 933 and 934 at a concentration of from $2\times10^{20}$ to $2\times10^{21}$ atoms/cm$^3$.

If closely considered, however, the impurity regions 933, 934 can be divided into two regions containing an impurity element that imparts the n-type. Third impurity regions 933a and 934a contain the impurity element that imparts the p-type at a concentration of from $1 \times 10^{20}$ to $1 \times 10^{21}$ atoms/cm$^3$ and fourth impurity regions 933b and 934b contain the impurity element that imparts the n-type at a concentration of from $1 \times 10^{17}$ to $1 \times 10^{20}$ atoms/cm$^3$. In the fourth impurity regions 933b and 934b, however, the impurity element for imparting the p-type is contained at a concentration of not smaller than $1 \times 10^{19}$ atoms/cm$^3$ and in the third impurity regions 933a and 934a, the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem.

Referring next to FIG. 10 (C), a first interlayer insulating film 937 is formed on the conductive layers 918 to 921 of the second shape and on the gate insulating film 906. The first interlayer insulating film 937 may be formed of a silicon oxide film, a silicon oxynitride film, a silicon nitride film, or a laminated layer film of a combination thereof. In any case, the first interlayer insulating film 937 is formed of an inorganic insulating material. The first interlayer insulating film 937 has a thickness of 100 to 200 nm. When the silicon oxide film is used as the first interlayer insulating film 937, TEOS and $O_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm$^2$. When the silicon oxynitride film is used as the first interlayer insulating film 937, this silicon oxynitride film may be formed from $SiH_4$, $N_2O$ and $NH_3$, or from $SiH_4$ and $N_2O$ by the plasma CVD method. The conditions of formation in this case are a reaction pressure of from 20 to 200 Pa, a substrate temperature of from 300 to 400° C. and a high-frequency (60 MHz) power density of from 0.1 to 1.0 W/cm$^2$. As the first interlayer insulating film 937, further, there may be used a hydrogenated silicon oxynitride film formed by using $SiH_4$, $N_2O$ and $H_2$. The silicon nitride film, too, can similarly be formed by using $SiH_4$ and $NH_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this example, the heat treatment is conducted at 550° C. for 4 hours. When a plastic substrate having a low heat resistance temperature is used as the substrate 900, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}$/cm$^3$ in the semiconductor layer with hydrogen that is thermally excited. As another means of hydrogenation, the plasma hydrogenation may be executed (using hydrogen excited with plasma). In any way, it is desired that the defect density in the semiconductor layers 902 to 905 be suppressed to be not larger than $10^{16}$/cm$^3$. For this purpose, hydrogen may be added in an amount of from 0.01 to 0.1 atomic %.

Then, a second interlayer insulating film 939 of an organic insulating material is formed maintaining an average thickness of from 1.0 to 2.0 μm. As the organic resin material, there can be used polyimide, acrylic, polyamide, polyimideamide, or BCB (benzocyclobutene). When there is used, for example, a polyimide of the type that is heat polymerized after being applied onto the substrate, the second interlayer insulating film is formed being fired in a clean oven at 300° C. When there is used an acrylic, there is used the one of the two-can type. Namely, the main material and a curing agent are mixed together, applied onto the whole surface of the substrate by using a spinner, pre-heated by using a hot plate at 80° C. for 60 seconds, and are fired at 250° C. for 60 minutes in a clean oven to form the second interlayer insulating film.

Thus, the second interlayer insulating film 939 is formed by using an organic insulating material featuring good and flattened surface. Further, the organic resin material, in general, has a small dielectric constant and lowers the parasitic capacitance. The organic resin material, however, is hygroscopic and is not suited as a protection film. It is, therefore, desired that the second interlayer insulating film is used in combination with the silicon oxide film, silicon oxynitride film or silicon nitride film formed as the first interlayer insulating film 937.

Thereafter, the resist mask of a predetermined pattern is formed, and contact holes are formed in the semiconductor layers to reach the impurity regions serving as source regions or drain regions. The contact holes are formed by dry etching. In this case, a mixed gas of $CF_4$, $O_2$ and He is used as the etching gas, and the second interlayer insulating film 939 of the organic resin material is etched. Thereafter, $CF_4$ and $O_2$ are used as the etching gas to etch the first interlayer insulating film 937. In order to further enhance the selection ratio relative to the semiconductor layer, $CHF_3$ is used as the etching gas to etch the gate insulating film 570 of the third shape, thereby to form the contact holes.

Here, the conductive metal film is formed by sputtering and vacuum vaporization and is patterned by using a mask and is, then, etched to form source wirings 940 to 943 and drain wirings 944 to 946. Further, though not diagramed in this example, the wiring is formed by a laminate of a 50 nm thick Ti film and a 500 nm thick alloy film (alloy film of Al and Ti).

Then, a transparent conductive film is formed thereon maintaining a thickness of 80 to 120 nm, and is patterned to form a pixel electrode 947 (FIG. 11 (A)). Therefore, the pixel electrode 947 is formed by using an indium oxide-tin (ITO) film as a transparent electrode or a transparent conductive film obtained by mixing 2 to 20% of a zinc oxide (ZnO) into indium oxide.

Further, the pixel electrode 947 is formed being in contact with, and overlapped on, the connecting wiring 946 that is electrically connected to the drain region of driving TFTs 963.

Next, a third interlayer insulating film 949 having opening at a position that coincides with the pixel electrode 947 is formed as shown in FIG. 11B. The third interlayer insulating film 949 is capable of insulating, and functions as a bank to separate organic compound layers of adjacent pixels from each other. This example uses a resist to form the third interlayer insulating film 949.

The third interlayer insulating film 949 in this example has a thickness of about 1 μm. The opening has a so-called reverse taper shape whose width increases as the distance from the pixel electrode 947 is closed. The reverse taper shape is obtained by coating a resist film and thereafter covering the resist film with a mask except the portion where the opening is to be formed, irradiating the film with UV light, and then removing the exposed portion with a developer.

By shaping the third interlayer insulating film 949 into a reverse taper shape as in this example, organic compound layers of adjacent pixels are separated from each other when forming the organic compound layers in a later step. Therefore cracking or peeling of organic compound layers can be prevented even when the organic compound layers and the third interlayer insulating film 949 have different coefficient of thermal expansion.

Although a resist is used for the third interlayer insulating film in this example, polyimide, polyamide, acrylic, BCB (benzocyclobutene), or silicon oxide may be used instead in some cases. The third interlayer insulating film 949 may be an organic or inorganic material as long as it is capable of insulating.

An organic compound layer 950 is formed next by evaporation. Then a cathode (MgAg electrode) 951 and a protective electrode 952 are formed by evaporation. It is desirable to remove moisture completely from the pixel electrode 947 by subjecting the pixel electrode to heat treatment prior to forming the organic compound layer 950 and the cathode 951. This example uses an MgAg electrode as the cathode of the light emitting device but the cathode may be formed from other known materials.

A known material can be used for the organic compound layer 950. In this example, the organic compound layer has a two-layer structure consisting of a hole transporting layer and a light emitting layer. The organic compound layer may additionally have one or more layers out of a hole injection layer, an electron injection layer, and an electron transporting layer. Various combinations have been reported and the organic compound layer of this example can take any of those.

The hole transporting layer of this example is formed by evaporation from polyphenylene vinylene. The light emitting layer of this example is formed by evaporation from polyvinyl carbazole with 30 to 40% of PBD, that is a 1, 3, 4-oxadiazole derivative, being molecule-dispersed. The light emitting layer is doped with about 1% of Coumarin 6 as green luminescent center.

The protective electrode 952 alone can protect the organic compound layer 950 from moisture and oxygen, but it is more desirable to add a protective film 953. This example uses a silicon nitride film with a thickness of 300 nm as the protective film 953. The protective film and the protective electrode 952 may be formed in succession without exposing the device to the air.

The protective electrode 952 also prevents degradation of the cathode 951. A typical material of the protective electrode is a metal film mainly containing aluminum. Other materials may of course be used. Since the organic compound layer 950 and the cathode 91 are extremely weak against moisture, the organic compound layer, the cathode, and the protective electrode 952 are desirably formed in succession without exposing them to the air. The organic compound layer is thus protected from the outside air.

The organic compound layer 950 is 10 to 400 nm in thickness (typically 60 to 150 nm), and the cathode 951 is 80 to 200 nm in thickness (typically 100 to 150 nm).

Thus completed is a light emitting device structured as shown in FIG. 11B. A part 954 where the pixel electrode 947, the organic compound layer 950, and the cathode 951 overlap corresponds to the light emitting device.

A p-channel TFT 960 and an n-channel TFT 961 are TFTs of the driving circuit and constitute a CMOS circuit. The switching TFT 962 and the driving TFT 963 are TFTs of the pixel portion. The TFTs of the driving circuit and the TFTs of the pixel portion can be formed on the same substrate.

In the case of a light emitting apparatus using a light emitting device, its driving circuit can be operated by a power supply having a voltage of 5 to 6 V, 10 V, at most. Therefore degradation of TFTs due to hot electron is not a serious problem. Also, smaller gate insulating capacitance is preferred for the TFTs since the driving circuit needs to operate at high speed. Accordingly, in a driving circuit of a light emitting apparatus using an light emitting device as in this example, the second impurity region 929 and the fourth impurity region 933b of the semiconductor layers of the TFTs preferably do not overlap with the gate electrode 918 and the gate electrode 919, respectively.

The method of manufacturing the light emitting apparatus of the present invention is not limited to the one described in this example. The light emitting apparatus of the present invention can be fabricated by a known method.

In addition, Example 1 only shows the manufacturing method of a light emitting apparatus, however, the similar laser crystallization also is applicable to a liquid crystal display device having TFTs therein.

EFFECTS OF THE INVENTION

According to the invention, thin film transistors with controlled characteristics can be produced. Further, since laser beam can be scanned without moving a substrate, the throughput of crystallization can be increased. Further, in combination of these, high performance liquid crystal display device and EL display device can be manufactured at a high yield by mass production.

What is claimed is:

1. A method of manufacturing a semiconductor device comprising the steps of:
   forming a semiconductor film over a substrate;
   scanning a first region of the semiconductor film with a laser beam in a first direction to increase the crystallinity of the first region;
   changing a minor axis direction of the laser beam by using an optical system after scanning the first region;
   scanning a second region of the semiconductor film with the laser beam in a second direction to increase the crystallinity of the second region after changing the minor axis direction; and
   forming a first thin film transistor using the first region of the semiconductor film and a second thin film transistor using the second region of the semiconductor film,
   wherein said first direction is coincident with a charge transferring direction of the first thin film transistor and said second direction is coincident with a charge transferring direction of the second thin film transistor.

2. A method of manufacturing a semiconductor device according to claim 1, wherein said minor axis direction is changed by rotating an optical system.

3. A method of manufacturing a semiconductor device according to claim 2, further comprising a step of making a beam shape of the laser beam linear.

4. A method of manufacturing a semiconductor device according to claim 1, wherein a beam shape of the laser beam is made linear by using at least one cylindrical lens.

5. A method of manufacturing a semiconductor device according to claim 1, wherein the first region and the second region are scanned with the laser beam by using a galvanomirror.

6. A method of manufacturing a semiconductor device according to claim 1, further comprising a step of focusing the laser beam on the first region and the second region using an f-Ɵ) lens.

7. A method of manufacturing a semiconductor device according to claim 2, wherein the optical system comprises two cylindrical lenses.

8. A method of manufacturing a semiconductor device comprising the steps of:
  forming an amorphous semiconductor film over a substrate;
  scanning a first region of the amorphous semiconductor film with a laser beam in a first direction to crystallize the first region;
  changing a minor axis direction of the laser beam by using an optical system after scanning the first region;
  scanning a second region of the amorphous semiconductor film with the laser beam in a second direction to crystallize the second region after changing the minor axis direction; and
  forming a first thin film transistor using the first region of the semiconductor film and a second thin film transistor using the second region of the semiconductor film,
  wherein a first angle between said first direction and a charge transferring direction of the first thin film transistor and a second angle between said second direction and a charge transferring direction of the second thin film transistor are the different from each other.

9. A method of manufacturing a semiconductor device comprising the steps of:
  forming an amorphous semiconductor film over a substrate;
  scanning a first region of the amorphous semiconductor film with a laser beam in a first direction to crystallize the first region;
  changing a minor axis direction of the laser beam by using an optical system after scanning the first region;
  scanning a second region of the amorphous semiconductor film with the laser beam in a second direction to crystallize the second region after changing the minor axis direction; and
  forming a first thin film transistor using the first region of the semiconductor film and a second thin film transistor using the second region of the semiconductor film,
  wherein a first angle between said first direction and a charge transferring direction of the first thin film transistor and a second angle between said second direction and a charge transferring direction of the second thin film transistor are the same as each other.

10. A method of manufacturing a semiconductor device according to claim 1, wherein the semiconductor film is amorphous.

* * * * *

UNITED STATES PATENT AND TRADEMARK OFFICE
CERTIFICATE OF CORRECTION

PATENT NO. : 7,682,949 B2  Page 1 of 1
APPLICATION NO. : 11/525956
DATED : March 23, 2010
INVENTOR(S) : Koichiro Tanaka and Tomoaki Moriwaka It is certified that error appears in the above-identified patent and that said Letters Patent is hereby corrected as shown below:

On the title page item [56] should read 6,506,635 B1   1/2003   Yamazaki et al.
6,535,535 B1   3/2003   Yamazaki et al.
6,849,482 B2   2/2005   Yamazaki et al.
6,944,195 B2   9/2005   Yamazaki et al.
7,095,762 B2   8/2006   Yamazaki et al.
7,362,784 B2   4/2008   Yamazaki et al.

2005/0092998 A1     5/2005   Yamazaki et al.
2008/0254598 A1     10/2008  Yamazaki et al.

JP 2000-306834 A    11/2000   Tanaka et al.
JP 2000-299470 A    10/2000   Tanaka et al.
JP 2000-243970 A    9/2000    Ogawa et al.
JP 2000-243969 A    9/2000    Ogawa et al.

Signed and Sealed this

Eleventh Day of May, 2010

David J. Kappos
*Director of the United States Patent and Trademark Office*